(12) United States Patent
Pehike et al.

(10) Patent No.: US 6,380,802 B1
(45) Date of Patent: Apr. 30, 2002

(54) TRANSMITTER USING INPUT MODULATION FOR ENVELOPE RESTORATION SCHEME FOR LINEAR HIGH-EFFICIENCY POWER AMPLIFICATION

(75) Inventors: David R. Pehike; William O. Camp, Jr., both of Chapel Hill; Antonio J. Montalvo, Raleigh, all of NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/752,417

(22) Filed: Dec. 29, 2000

(51) Int. Cl.[7] .............................. H03F 3/38; H03F 3/217; H03G 3/20
(52) U.S. Cl. ....................... 330/10; 330/136; 330/251
(58) Field of Search .................. 330/10, 136, 207 A, 330/207 P, 251, 298

(56) References Cited

U.S. PATENT DOCUMENTS

| | | | | |
|---|---|---|---|---|
| 4,733,194 A | * | 3/1988 | Roehrs et al. | 330/251 |
| 5,479,337 A | * | 12/1995 | Voigt | 330/10 |
| 5,535,438 A | * | 7/1996 | Sevic | 330/207 A |
| 5,675,288 A | * | 10/1997 | Peyrotte et al. | 330/136 |
| 5,847,602 A | * | 12/1998 | Su | 330/10 |

* cited by examiner

Primary Examiner—Robert Pascal
Assistant Examiner—Patricia T. Nguyen
(74) Attorney, Agent, or Firm—Coats & Bennett, P.L.L.C.

(57) ABSTRACT

An apparatus and method for creating an amplifier input waveform based on received phase and amplitude information from an input signal. The apparatus includes a first switch receiving phase information from a primary waveform and a second switch in communication with the first switch and the input. The second switch receives amplitude information from the primary waveform and receives the phase information from the first switch and uses the amplitude information to modulate the phase information. A secondary waveform is thus created for input to the amplifier load matching network. In this way, an amplitude modulated waveform is amplified at high efficiency, enabling application of either all or part of the phase and/or amplitude modulation at the input of the amplifier.

21 Claims, 4 Drawing Sheets

TRANSMITTER USING INPUT MODULATION FOR ENVELOPE RESTORATION SCHEME FOR LINEAR HIGH-EFFICIENCY POWER AMPLIFICATION

BACKGROUND OF THE INVENTION

The present invention relates to power amplifiers. In particular, the invention relates to a system and apparatus utilizing an input modulation scheme for linear high efficiency power amplification.

The present invention also relates to efficient amplification of signals whose envelope is amplitude modulated, and specifically the application of linear amplification at RF frequencies of such signals up to high power levels.

In applications that are constrained by limited available DC power (say from a fixed capacity battery power supply), there is a challenge to tailor the waveforms present at the active device output (at any given stage along the chain of amplification) such that power is not dissipated within the active device and is retained for the conversion from DC to RF signal energy. The less power dissipated within the active device, the higher the efficiency of the amplifier. Dissipated power within the active device occurs when there is a simulataneous overlap of non-zero voltage and current of the carrier signal at the output terminal of that device. This product of non-zero voltage and current is wasted energy that detracts from the intended output signal power at the carrier frequency and degrades efficiency. Various techniques and amplifier topologies exist which minimize the finite overlap of current and voltage to a varying degree, and these may be applied in combination with the proposed invention for maximum efficiency when finite amplitude modulation is required.

In applications that also require linear amplification of desired signals, the same clipping that enhances efficiency may degrade linearity. The requirement for an amplified replica of the input signal is difficult to achieve if the waveform is "clipped" or distorted.

This distortion affects certain aspects of the input signal more than others. Just as the input signal can be described to have an amplitude modulation and phase modulation, the distortion can be described as a matrix which when multiplied by those amplitude modulation and phase modulation components will yield the resultant amplitude modulation and phase modulation components at the output. For example, $$\begin{bmatrix} AM_o \\ PM_o \end{bmatrix} = \begin{bmatrix} AM_o/AM_i & AM_o/PM_i \\ PM_o/AM_i & PM_o/PM_i \end{bmatrix} \cdot \begin{bmatrix} AM_i \\ PM_i \end{bmatrix}$$

For certain signals which do not contain any amplitude modulation and only carry information through PM information, the only term of significance in this equation is the $PM_o/PM_i$ term. Often the phase changes induced from a purely phase-modulated input signal do not induce large phase distortion even in very nonlinear amplifiers. Accordingly, a very efficient nonlinear power amplifier can be used to amplify the phase-modulated input without significant degradation in the critical phase information.

This is not the case for amplitude-modulated signals, however, wherein a large envelope amplitude can induce significant amplitude distortion as a result of amplifier nonlinearities. Large changes in amplitude at the device input typically cause large changes in the device capacitances and conductances, all of which vary nonlinearly. These nonlinear conductance and capacitance changes result in significant distortion of the waveform seen at the output. This distortion ultimately degrades the ability of the power amplifier to meet the linearity requirements of its application. At the same time, the efficiency benefits of operating an amplifier nonlinearly are significant, and thus the use of nonlinear amplifiers to linearly amplify signals with strong amplitude modulation has been an area of much study.

Established approaches exist to restore the amplitude modulation envelope on the output of a nonlinear amplification stage, which is itself able to achieve a very high efficiency, and therefore the system solution modulating that core amplifier is able to attain high efficiency. Such approaches generally rely on the use of a phase-modulated signal of constant envelope at the amplifier input. The nonlinear amplifier can efficiently amplify the phase modulation component without AM/AM and AM/PM distortion. The amplitude modulation envelope information is then restored at the amplifier output without inducing amplitude distortion at that stage.

One well-known approach for separately amplifying amplitude and phase information is Linear Amplification Using Nonlinear Components (LINC). The technique utilizes a pair of amplifier chains, each operating on constant-envelope signals whose relative phase is varied such that their sum results in a desired envelope having varying amplitude. The power combining of the two chains at their output sums the coherent parts of each waveform and places that result on the output. The destructive interference between the two signals is dissipated in the termination resistor of the power combining element. This dissipation can significantly degrade the efficiency of the overall amplifier, especially when the two signals are signficantly out of phase in order to reach a minimum desired output amplitude.

Envelope Elimination and Restoration (EER), or Kahn-technique transmission, is also well-known. Like LINC, EER involves the use of a constant envelope phase modulated input signal. EER, however, restores the amplitude modulated envelope information directly on the supply line of the output DC supply. By directly modulating the supply voltage on the output, the resultant waveform consists of the amplified phase information to a saturated level defined by the supply voltage. The output then restores the envelope by becoming the upper and lower limits within which the amplified phase waveform is bracketed. Modulation of the supply voltage can be problematic, however, as the spurious output of the switching regulator can interfere significantly with the desired envelope. Furthermore, to minimize the effect of the switching regulator interference, it must be switched at a high rate and the intermodulation spurs at its output must be filtered down to very low frequency. As a result, if a feedback loop is required in order to correct for amplitude distortion, the bandwidth of that loop is constrained to be extremely small and unusable for wide bandwidth channel communications.

There is therefore a need for an improved envelope restoration scheme that overcomes the limitations of power combining losses in LINC, and the switching regulator limitations in standard EER/Kahn implementations.

BRIEF SUMMARY OF THE INVENTION

In accordance with the present invention, the preferred embodiments described herein provide an apparatus and method for creating an input waveform based on received phase and amplitude information for a standard class E output load matching network. In particular, the present invention may be embodied in an active switching circuit including a first switch receiving phase information from a primary waveform and a second switch in communication with the first switch and the input. The second switch receives amplitude information from the primary waveform and receives the phase information from the first switch and uses the amplitude information to modulate the phase information. A secondary waveform is thus created for input to the matching network.

In another aspect of the invention, the first switch receives amplitude information from the primary waveform and the second switch receives phase information from the primary waveform. The second switch uses the phase information to modulate the amplitude information to create the secondary waveform.

The invention may also be embodied in a method for providing a waveform for input to the output load matching network of a class E amplifier. The method includes the steps of separating phase and amplitude information from a primary waveform and controlling an electric current through a first switch in accordance with the amplitude information to provide a first switched output. The first switched output is then provided from the first switch to a second switch. The second switch controls the output in accordance with the phase information to create a second switched output. This second switched output creates a secondary waveform for input to the matching network.

In yet another aspect of the invention, the method includes the steps of separating phase and amplitude information from a primary waveform, and controlling an electric current through a first switch in accordance with the phase information to provide a first switched output. The first switched output is provided from the first switch to a second switch. The second switch controls the first switched output in accordance with the amplitude information to create a second switched output. The second switched output is provided as a secondary waveform input into an amplifier output load matching network.

In yet another aspect of the invention, the method includes the steps of separating amplitude information and phase information from a primary waveform and receiving the phase information into a first switch. The phase information is then passed from the first switch to a second switch, which modulates the phase information to create the secondary waveform.

Advantages of the present invention will become readily apparent to those skilled in the art from the following description of the preferred embodiments of the invention which have been shown and described by way of illustration. As will be realized, the invention is capable of other and different embodiments, and its details are capable of modifications in various respects. Accordingly, the drawings and description are to be regarded as illustrative in nature, and not as restrictive.

DETAILED DESCRIPTION OF THE INVENTION

Figure 1:
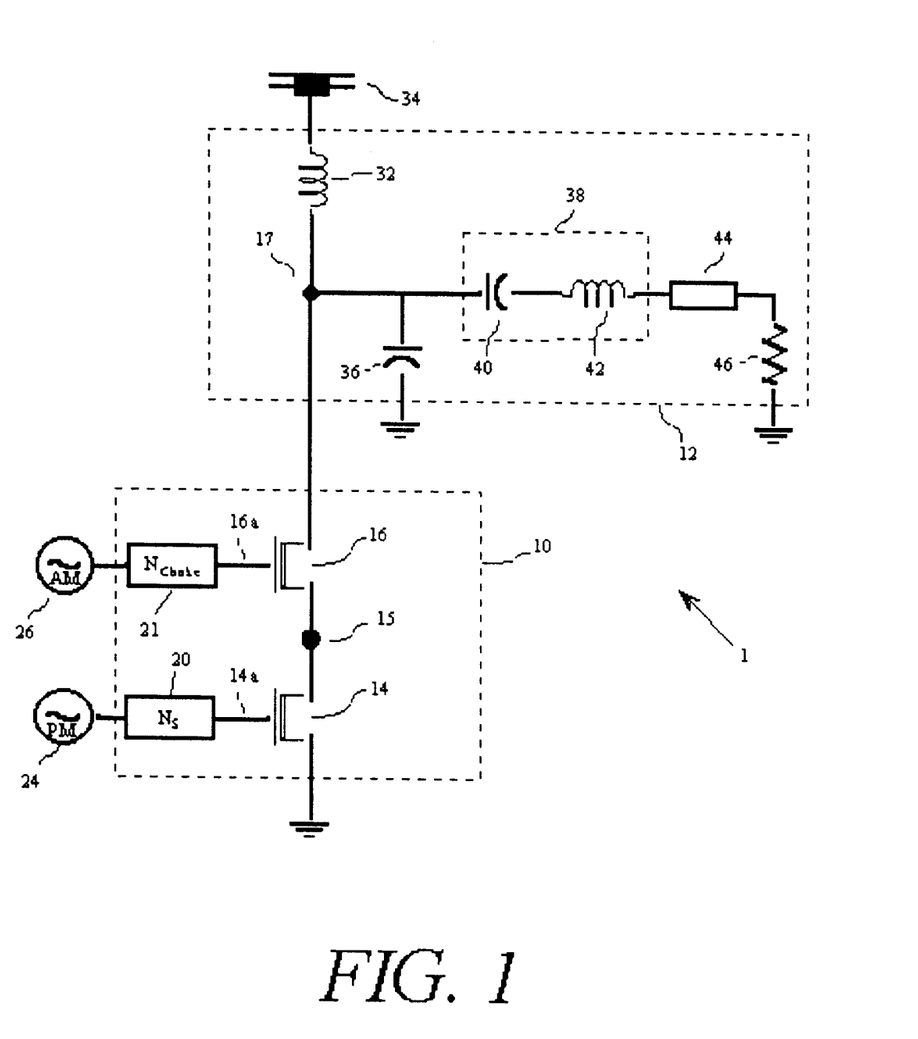
FIG. 1 is a schematic diagram of a first embodiment of a circuit implementing the present invention.

Turning now to the drawings, wherein like numeral designate like components, FIG. 1 is a diagram of a active device switching circuit 10 combined with an output load matching network 12 to make up an amplifier 1. The circuit 10 preferably includes a pair of switching devices 14 and 16, each of which may be independently controlled to exhibit different resistances to the total current flowing through the pair. The switching devices should be lower minimum "ON" resistance devices with high-speed switching capabilities, one example would be the MwT—5 Dual-gate FET (reference http://www.mwtinc.com/cat/fets/htm/new-html/MwT—5_1.htm) manufactured by MwT, inc. These devices are exemplary only for this embodiment, and a wide variety of other components or structures may be substituted for the components described in accordance with the knowledge of one skilled in the art.

The switching devices 14, 16 are linked in series or "cascode" as shown connected to the output load matching network 12 at node 17. The gates 14a and 16a of each of the transistors 14 and 16 receive phase information 24 and amplitude information 26, respectively, from a primary waveform. The received information 24 and 26 into the gates 14a and 16a of the transistors 14 and 16 is utilized to vary the switching resistance of the transistors in accordance with the input primary waveform to create a secondary waveform at node 17.

The embodiment described here is a class E implementation for extremely high efficiency and other listed advantages, although other embodiments for the invention may consist of class C, or other amplifier modes of operation. A standard class E amplifier comprises a single transistor switch and the same output load matching network (12) as shown in the first embodiment of FIG. 1. The connection node 17 between the active switch devices 10 and this standard class E output load matching network 12 comprises an inductance coil 32 connecting to the supply voltage Vdd 34. A capacitance 36 which includes parasitic capacitance from the active device(s) in parallel with the active device output impedance. A tuned circuit filter 38 consisting of a capacitance 40 and an inductance 42 connected in series with a reactive component 44 and a load resistance 46, nominally 50 Ohm. Typically, frequency and phase modulation information is received from the switches at node 17, and amplitude modulation information is received by variation of the supply voltage Vdd at 34. However, in the present case, as will be described below, the phase and amplitude information 24 and 26 are both received as a switched input at 14a and 16a and use those input terminals to combine phase and amplitude information to a desired signal at node 17, such that the final signal delivered to the load 46 is as desired.

A matching network 20 is linked to input gate 14a of the active switching device 14 to provide optimum power transfer from the phase modulated source to the switching device 14. The matching network 20 may comprise a number of reactive elements according to known methods. Another matching network 21 is linked to the input gate 16b of the active switching device 16 to block any phase information from reaching the amplitude modulated source, while still providing a low frequency path from the amplitude modulated source to the switching device 16. This second matching network also may comprise a combination of reactive elements according to known methods.

During operation, the active switching device 14 is gated on and off through the gate 14a in accordance with the received phase information 24. Similarly, the switching device 16 is gated on and off via the input 16a in accordance with envelope information 26 received at the gate. Given that one switch switches at an RF frequency between an entirely off state to an entirely on state, the output across the load 46 of the matching network 12 of the amplifier 1 is determined by the total "ON" resistance of the pair of switching devices 14 and 16. The output can be modulated by the switch having the higher "ON" resistance. In the present case, switch 16 can thus be driven with a low frequency signal so that the "ON" resistance of the switch 16 produces a flexibly adjusted output amplitude and thus restores the output envelope amplitude. The second switch 16 is continuously variable and allows for a smoothly continuous change in the "ON" resistance, and an associated continuous change in the output envelope amplitude.

The switching device 16 slowly varies the envelope information. The function of this information in the switch configuration of the circuit 10 provides additional isolation of the RF feedthrough between the high-speed switching of the phase information input and the node connected to the load network. The switching device 14 receives a high-frequency input and has a direct source connection to the load-inductance ground for enhanced stability. The node 15 between the switches 14 and 16 traces the output node connected to the load network, thereby causing the switch 16 to switch on and off at the same frequency as the lower switch. The switching device 14 receives a high-frequency input and has a direct source connection to low inductance ground for enhanced stability. Preferably, the switches are capable of switching at high frequencies so that maximum gain and efficiency may be attained from this cascode configuration.

The present switching circuit 10 advantageously allows a single RF input into the matching network 12 and a second low-frequency baseband envelope input to achieve the variable "ON" resistance necessary for input into the matching network 12. This reduces the necessity for multiple RF inputs and associated high-frequency signal lines on valuable circuit board real estate. Furthermore, the requirement for multiple matching networks or multiplexing functions preceding the actual matching network 12 are not required.

The adjustment of the switch 16 to a higher total "ON" resistance will decrease the output amplitude and power, but also the related power-added efficiency of the amplifier 1. In typical class E amplifiers, significant efficiencies can be achieved even for the higher "ON" resistance states. Because of this fact, the operation of the amplifier 1 under back-off can result in efficient amplification down to even low output powers for the same fixed power supply voltage. Thus, significant gains in efficiency can be achieved with discrete voltages from a switched power supply regulator made active for low power levels. Thus, the present circuit 10 allows for changes in the power supply voltage without any need for modifications in the load network and the output power will scale with the fixed power supply to continue to provide peak efficiency.

Figure 2:
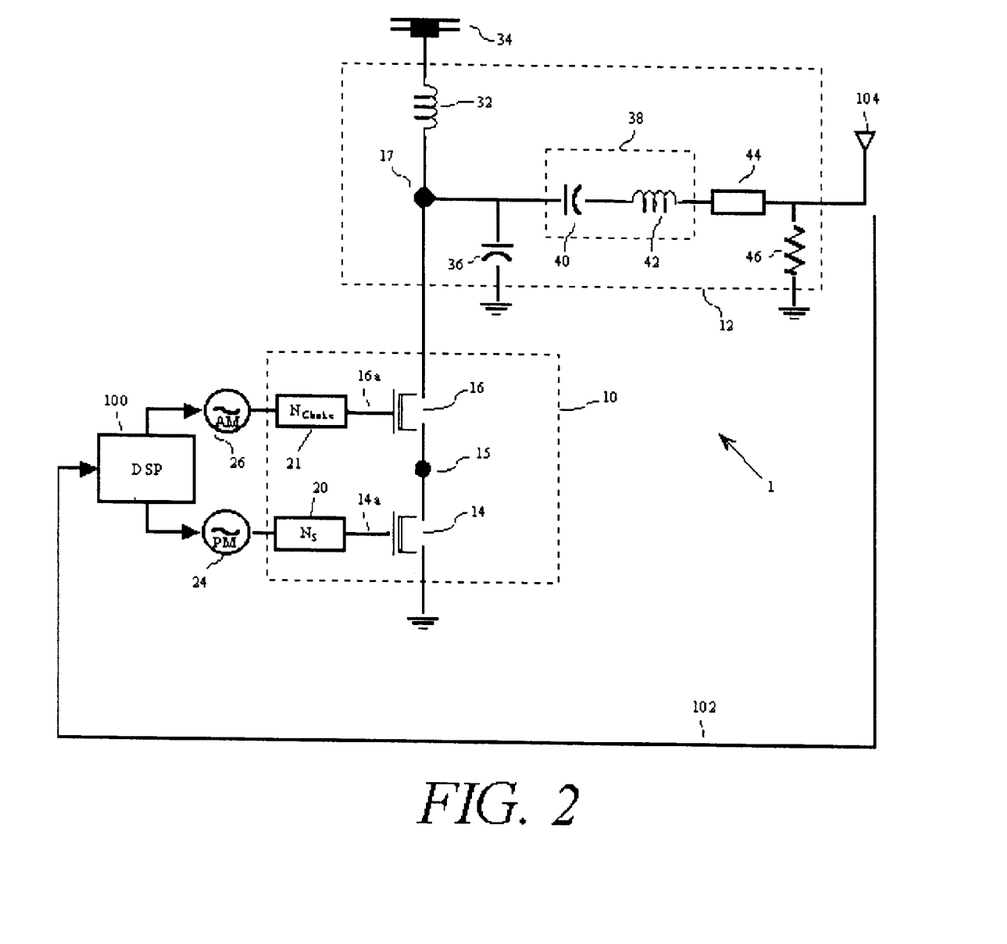
FIG. 2 is a schematic diagram illustrating a modification to the circuit shown in FIG. 1.

In the present embodiment, there is some predistortion required to input the correct waveform to the switch 16 to achieve the desired output waveform from the amplifier 1. A unique input waveform for any given desired output may be defined so that a baseband digital signal processor can properly generate the corrected input waveform. A circuit to accomplish this is depicted in FIG. 2, which shows a digital signal processor 100 connected to input a predistorted waveform to the switch 16. This predistortion methodology is well-known in the art. In the alternative, an additional feedback loop may be implemented to periodically update the input-to-output relationship in accordance with any long-term degradation requirements. For instance, a feedback loop 102 may be used to sense any voltage standing wave ratio ("VSWR") reflection from the antenna 104. The feedback loop may then control the digital signal processor 100 to adjust the amplitude information to correct for any VSWR reflection before the amplitude information is received by the switch 16a.

It is important to note that the functions of the switches 14 and 16 in the present embodiment of FIG. 1 can be exchanged so that the lower switch modulates the envelope and the upper switch is switched at high frequency to deliver the phase information. Although the two signals (amplitude and phase) are intermixed in either situation, varying differences in performance may be achieved.

Figure 3:
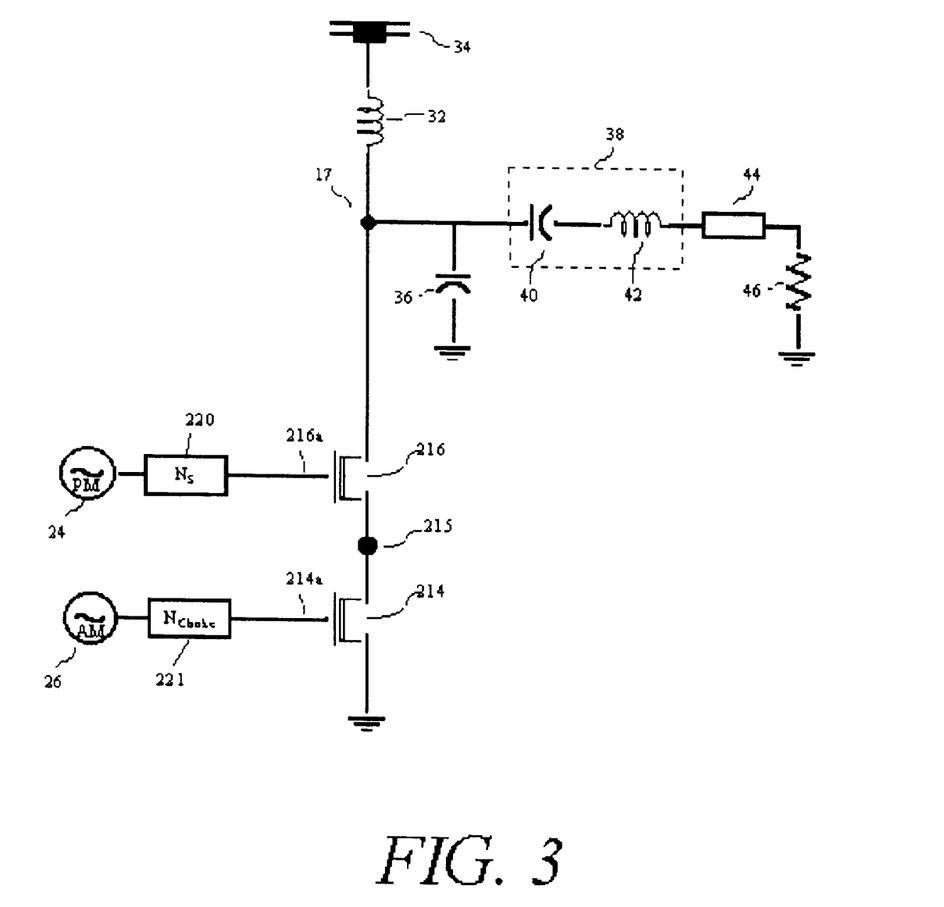
FIG. 3 is a diagram illustrating a second embodiment of a circuit implementing the present invention.

A second embodiment utilizing reversed inputs 26 and 24 into the switches 214 and 216 is shown in the schematic diagram of FIG. 3. As shown in the Figure, less feedthrough isolation is provided between the RF phase input 216a and the output node 217 connected to the load network. Stability of the amplifier may be compromised by the output impedance of the switch 214, which is presented to the source of the switch 216 running at high-frequency. The use of the switch 214 to increase the resistance of the pair of switches 214 and 216 places higher resistances at the source terminal of the high-speed switch 216. This effects a decrease in the effective transconductance and maximum switching speed of the switch 216. The node 215 between switches 214 and 216 is preferably tied close to ground and is not forced to follow the upper node during the switching cycle, thereby more effectively separating the slowly varying envelope and high-speed phase information to be controlled. In the present embodiment shown, only the upper switch is allowed to switch at high frequency, while the lower switch is "ON" at all times with a slowly varying resistance. This allows the use of separate switch technologies to be easily implemented for the switches 214 and 216. Thus, the lower switch may be implemented using a device appropriate for slowing varying on resistance, such as a MOSFET, while the switch 216 may be implemented in a high-performance FET, such as a pHEMT, as is known in the art.

The overall phase distortion due to variations in the output supply voltage of switching regulator-based EER implementations is alleviated in the present embodiments. This is due to the fact that the parasitic capacitance does not vary with output DC voltage in the active switching device. The output supply remains constant. The addition of switching devices, however, does increase the total "nonlinear" parasitic capacitance required at the input to the loading network, and as such would be susceptible to changes in the average DC value. But in the present embodiments the "average" DC value is maintained at the battery voltage without change.

A significant advantage of this approach is that the modulation can be applied directly from baseband without the need for delivering large DC current directly from the modulating source. The use of baseband to deliver the envelope assures direct software control of the envelope of the amplifier for application of the same saturated amplifier core for different modulation formats and input signals. Improved system-level control of the waveforms is then possible, thereby facilitating complementary schemes used in conjunction with the present embodiment such as phase correction feedback or adaptive predistortion.

Additional embodiments of the invention may include the use of some portion of the amplitude modulation on the phase signal, and some portion of the phase modulation on the amplitude signal 26 in order to further reduce the bandwidth requirements of those two input signals. When a filtered IQ signal is broken out into separate amplitude and phase components, those amplitude and phase components typically have much larger bandwidth than the original IQ representation. The predistortion of the amplitude signal required for generation of the desired output helps to reduce the bandwidth requirement of the amplitude signal, as it reduces the required sharp amplitude cusps that occur during the minmium of typical digital modulation waveform envelopes. Further relaxation of the bandwidth requirements can be achieved using some combination of the amplitude and phase signals on either/both of the input signals 24 and 26.

The class E amplifier topology exhibits the highest optimum load resistance of any of the amplifier topologies, which is especially important as the supply voltage is decreased and other topologies suffer from matching losses and parasitic limitations to peak efficiency. There is the potential for less power lost in impedance transformation to the 50 Ohm filter, duplexer, and antenna interfaces.

Moreover, the stability of the switch-based prior art is not an issue in the present embodiments due to the low gain states of the ON and OFF states. This enables the use of lower gate dimension FET technologies for the switches whose higher IDSS enables smaller devices and die sizes, as well as faster switching speeds for high efficiency.

Figure 4:
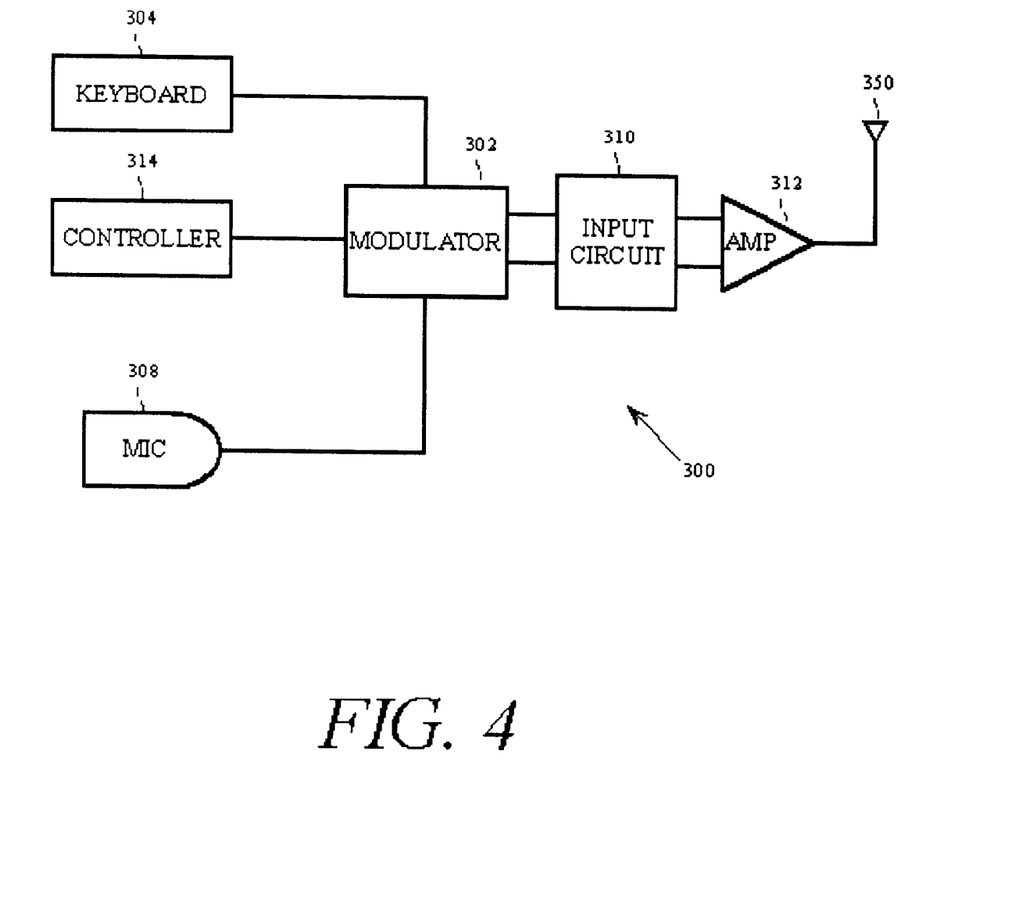
FIG. 4 is a block diagram of a communication device in accordance with the present invention.

Referring now to FIG. 4, a block diagram schematic of a communication device 300 in accordance with the present invention is illustrated. The communication device 300 is preferably a wireless transmitter used for the transmission of modulated signals. A modulator 302 receives voice input from microphone 308 and text input from keyboard 304. The signals from the microphone 308 and keyboard 304 are processed within the modulator 302 to phase modulate a carrier signal using well-known phase modulation techniques. The phase modulated signals are coupled to an input circuit 310 and processed in accordance with the embodiments described above. The resultant output is coupled to a preferably E-class amplifier 312. The output of the amplifier 312 is subsequently coupled to the antenna 350. Control device 314 preferably controls operation of the modulator 302. While only a minimum number of components are shown in the schematic of FIG. 4, one skilled in the art may readily substitute componentry or modify the circuit to provide working alternatives to the system of the present embodiment.

Of course, it should be understood that a wide range of changes and modifications can be made to the preferred embodiments described above. For example, different technologies can be used for the pair of switches shown in the circuits of the preferred embodiments above to exploit the capabilities and different functionality of each switch. Such substitutions, taking into account the performance trade-offs of using either the upper or lower switch for modulating the envelope will be different for each case.

Thus, it is intended that the foregoing detailed description be regarded as illustrative rather than limiting, and that it be understood that it is the following claims, including all equivalents, which are intended to define the scope of this invention.

What is claimed is:

1. A switching circuit for providing a waveform for input into a load matching network in a "class E" amplifier, said circuit comprising:

a first switch receiving phase information from a primary waveform;

a second switch in communication with said first switch and said input and receiving amplitude information from said primary waveform; and wherein said second switch receives said phase information from said first switch and uses said amplitude information to modulate said phase information to create a secondary waveform for input to said matching network.

2. The circuit of claim 1 wherein said secondary waveform is an approximation of said primary waveform.

3. The circuit of claim 1 wherein said first and second switches are transistors each having a gate, said first switch receives said phase information at its gate, and said second switch receives said amplitude information at its gate.

4. The circuit of claim 1 further comprising a digital signal processing device in communication with said second switch, wherein said digital signal processing device adjusts said amplitude information before it is received into said second switch to correct for distortion in said amplitude information.

5. The circuit of claim 1 further comprising:

a digital signal processing device in communication with said second switch; and a feedback loop for sensing VSWR reflection from an antenna in communication with said amplifier, said feedback loop in communication with said digital signal processing device;

wherein said digital signal processing device adjusts said amplitude information before it is received into said second switch to correct for said VSWR reflection.

6. A switching circuit for providing a waveform for input into the load matching network in a "class E" amplifier, said circuit comprising:

a first switch receiving amplitude information from a primary waveform;

a second switch in communication with said first switch and said input and receiving phase information from a primary waveform; and wherein said second switch receives said amplitude information from said first switch and uses said phase information to modulate said amplitude information to create a secondary waveform for input to said matching network.

7. The circuit of claim 6, wherein said secondary waveform is an approximation of said primary waveform.

8. The circuit of claim 6 wherein said first and second switches are transistors each having a gate, said first switch receives said amplitude information at its gate, and said second switch receives said phase information at its gate.

9. The circuit of claim 6 further comprising a digital signal processing device in communication with said first switch, wherein said digital signal processing device adjusts said amplitude information before it is received into said first switch to correct for distortion in said amplitude information.

10. The circuit of claim 6 further comprising:

a digital signal processing device in communication with said second switch; and a feedback loop for sensing VSWR reflection from an antenna in communication with said amplifier, said feedback loop in communication with said digital signal processing device;

wherein said digital signal processing device adjusts said amplitude information before it is receive by said first switch to correct for said VSWR reflection.

11. A method for providing a waveform for input to the load matching network of a "class E" amplifier, said method comprising the steps of:

separating amplitude information and phase information from a primary waveform;

receiving said phase information into a first switch;

passing said phase information from said first switch to a second switch;

receiving said amplitude information into said second switch;

modulating said phase information with said second switch to create a secondary waveform; and providing said secondary waveform as an input to said matching network.

12. A method for providing a waveform for input to the load matching network of a "class E" amplifier, said method comprising the steps of:

separating phase and amplitude information from a primary waveform;

controlling an electric current through a first switch in accordance with said phase information to provide a first switched output;

passing said first switched output from said first switch to a second switch;

controlling said first switched output through said second switch in accordance with said amplitude information to create a second switched output;

outputting said second switched output from said second switch to create a secondary waveform; and providing said secondary waveform as an input to said matching network.

13. The method of claim 12 wherein said secondary waveform is an approximation of said primary waveform.

14. The method of claim 12 wherein said first and second switches are transistors each having a gate, said first switch receives said phase information at its gate to control said electric current through said first switch, and said second switch receives said amplitude information at its gate to control said first switched output through said second switch.

15. The method of claim 12 further comprising the step of adjusting said amplitude information before controlling said first switched output through said second switch to correct for distortion in said amplitude information.

16. The method of claim 12 further comprising the step of:

sensing VSWR reflection from an antenna in communication with said amplifier; and adjusting said amplitude information before controlling said first switched output through said second switch to correct for said VSWR reflection.

17. A method for providing a waveform for input to the load matching network of a "class E" amplifier, said method comprising the steps of:

separating phase and amplitude information from a primary waveform;

controlling an electric current through a first switch in accordance with said amplitude information to provide a first switched output;

passing said first switch ed output from said first switch to a second switch;

controlling said first switched output through said second switch in accordance with said phase information to create a second switched output;

outputting said second switched output from said second switch to create a secondary waveform; and providing said secondary waveform as an input to said matching network.

18. The method of claim 17 wherein said secondary waveform is an approximation of said primary waveform.

19. The method of claim 17 wherein said first and second switches are transistors each having a gate, said first switch receives said amplitude information at its gate to control said electric current through said first switch, and said second switch receives said phase information at its gate to control said first switched output through said second switch.

20. The method of claim 17 further comprising the step of adjusting said amplitude information before controlling electric current through said first switch to correct for distortion in said amplitude information.

21. The method of claim 17 further comprising the step of:

sensing VSWR reflection from an antenna in communication with said amplifier; and adjusting said amplitude information before controlling electric current through said first switch to correct for distortion in said amplitude information.

* * * * *

UNITED STATES PATENT AND TRADEMARK OFFICE
CERTIFICATE OF CORRECTION

PATENT NO.   : 6,380,802 B1
DATED         : April 30, 2002
INVENTOR(S)  : Pehlke et al.

It is certified that error appears in the above-identified patent and that said Letters Patent is hereby corrected as shown below:

<u>Title page,</u>
Item [75], correct the spelling of the last name of inventor David R. Pehlke from "Pehike" to -- PEHLKE --

Signed and Sealed this

Ninth Day of July, 2002

*Attest:*

*Attesting Officer*

JAMES E. ROGAN
*Director of the United States Patent and Trademark Office*